(12) United States Patent
Shifrin et al.

(10) Patent No.: US 10,648,925 B2
(45) Date of Patent: May 12, 2020

(54) REPEATER DEFECT DETECTION

(71) Applicant: KLA-Tencor Corporation, Milpitas, CA (US)

(72) Inventors: Eugene Shifrin, Sunnyvale, CA (US); Bjorn Brauer, Beaverton, OR (US); Sumit Sen, Sunnyvale, CA (US); Ashok Mathew, Fremont, CA (US); Sreeram Chandrasekaran, Santa Clara, CA (US); Lisheng Gao, Saratoga, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 206 days.

(21) Appl. No.: 15/828,632

(22) Filed: Dec. 1, 2017

(65) Prior Publication Data

US 2018/0348147 A1 Dec. 6, 2018

Related U.S. Application Data

(60) Provisional application No. 62/515,445, filed on Jun. 5, 2017, provisional application No. 62/515,449, filed on Jun. 5, 2017.

(51) Int. Cl.
| | |
|---|---|
| *G06K 9/00* | (2006.01) |
| *G01N 21/95* | (2006.01) |
| *G01N 21/956* | (2006.01) |
| *H01L 21/66* | (2006.01) |

(52) U.S. Cl.
CPC ....... *G01N 21/9501* (2013.01); *G01N 21/956* (2013.01); *H01L 22/12* (2013.01); *H01L 22/20* (2013.01); *G01N 2201/10* (2013.01); *G01N 2201/126* (2013.01)

(58) Field of Classification Search
None
See application file for complete search history.

(56) References Cited

U.S. PATENT DOCUMENTS

| | | | |
|---|---|---|---|
| 6,727,512 B2 * | 4/2004 | Stokowski | G01N 21/95607 250/559.45 |
| 6,882,745 B2 * | 4/2005 | Brankner | G01N 21/95607 382/144 |

(Continued)

OTHER PUBLICATIONS

Van den Heuvel et al, "Investigation of the performance of state-of-the-art defect inspection tools within EUV lithography." In Metrology, Inspection, and Process Control for Microlithography XXVI, vol. 8324, p. 83240L. International Society for Optics and Photonics, 2012. (Year: 2012).*

(Continued)

*Primary Examiner* — Feng Niu
(74) *Attorney, Agent, or Firm* — Hodgson Russ LLP

(57) ABSTRACT

Defects from a hot scan can be saved, such as on persistent storage, random access memory, or a split database. The persistent storage can be patch-based virtual inspector virtual analyzer (VIVA) or local storage. Repeater defect detection jobs can determined and the wafer can be inspected based on the repeater defect detection jobs. Repeater defects can be analyzed and corresponding defect records to the repeater defects can be read from the persistent storage. These results may be returned to the high level defect detection controller.

19 Claims, 9 Drawing Sheets

(56) References Cited

U.S. PATENT DOCUMENTS

| | | | |
|---|---|---|---|
| 7,783,102 B2* | 8/2010 | Kawaragi | G01N 21/956 382/145 |
| 7,783,104 B2* | 8/2010 | Kawaragi | B81C 99/005 382/149 |
| 7,804,993 B2* | 9/2010 | Dorphan | G01N 21/95607 382/141 |
| 8,041,106 B2* | 10/2011 | Tung-Sing Pak | G01N 21/956 356/237.2 |
| 8,126,255 B2* | 2/2012 | Bhaskar | G06T 7/001 382/141 |
| 8,781,781 B2* | 7/2014 | Kulkarni | G05B 23/0297 702/108 |
| 9,008,410 B2* | 4/2015 | Huang | G06T 7/0004 382/149 |
| 9,552,636 B2* | 1/2017 | Wu | G06T 7/001 |
| 9,766,186 B2* | 9/2017 | Chen | G01N 21/9501 |
| 10,242,290 B2* | 3/2019 | Tarshish-Shapir | G06T 7/0004 |
| 2003/0130806 A1 | 7/2003 | Mizuno et al. | |
| 2004/0016897 A1* | 1/2004 | Stokowski | G01N 21/95607 250/559.45 |
| 2009/0080759 A1 | 3/2009 | Bhaskar et al. | |
| 2010/0142800 A1 | 6/2010 | Tung-Sing Pak et al. | |
| 2012/0029858 A1 | 2/2012 | Kulkarni et al. | |
| 2014/0136137 A1* | 5/2014 | Tarshish-Shapir | G06T 7/0004 702/108 |
| 2016/0027165 A1 | 1/2016 | Wu et al. | |
| 2016/0061749 A1* | 3/2016 | Chen | G01N 21/9501 356/237.5 |
| 2018/0144442 A1* | 5/2018 | Brauer | G06K 9/6202 |

OTHER PUBLICATIONS

ISA/KR, International Search Report and Written Opinion for PCT/US2018/035888 dated Sep. 21, 2018.

* cited by examiner

RDD Setup Options

Option 1: On inspection tool, both patches and attributes are available in lot result.

Option 2: On VIVA, both patches and attributes are available in lot result.

RDD Production Options

Option 1: On inspection tool, both patches and attributes are available in lot result.

Option 2: On inspection tool, no patches in lot result.

RDD Setup and Production Proposal

- Optimize both throughput and development time

Setup: On VIVA, both patches and full attributes are available in lot result.

Production: On inspection tool, no patches, partial attributes are available in lot result.

RDD Setup and Production Proposal

- Optimize both throughput for final product

Setup: On inspection tool, both patches and full attributes are available in lot result.

Production: On inspection tool, no patches, partial attributes are available in lot result

REPEATER DEFECT DETECTION

CROSS-REFERENCE TO RELATED APPLICATIONS

This application claims priority to the provisional patent applications assigned U.S. App. No. 62/515,445 and U.S. App. No. 62/515,449, both filed Jun. 5, 2017, the disclosures of which are hereby incorporated by reference.

FIELD OF THE DISCLOSURE

This disclosure relates to inspection of semiconductor wafers.

BACKGROUND OF THE DISCLOSURE

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production. Thus, minimizing the total time from detecting a yield problem to fixing it determines the return-on-investment for the semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Extreme ultraviolet (EUV) lithography increases the need for robust detection of repeater defects. There are no actinic light mask inspectors for EUV. Thus, the task of mask inspection shifts from mask-inspectors to wafer-inspectors. The frequency of in-line mask inspections can be rather high since there is no pellicle for EUV masks and the masks are exposed during operation.

Defect review for advanced design rules can be for objects that are quite small (e.g., for detection of defects below 10 nm), so hot scans may be run to catch such defects. A "hot scan" generally refers to a measurement/inspection of a wafer performed to detect defects or take measurements on the wafer by applying relatively aggressive detection settings (e.g., thresholds substantially close to the noise floor). In this manner, the hot scan may be performed to collect inspection or measurement data about the wafer that will be used for the tuning process (optics selection and algorithm tuning). The goal of the hot scan may be to detect a representative sample of all defect and nuisance types on the wafer in the selected mode(s).

Repeater detection (e.g., with coordinates matching) can be a strong filter that can bring the nuisance density to manageable levels. However, a repeater defect detection (RDD) algorithm is typically performed as the last inspection step and requires all defects to be collected in the final lot result. Hot inspections required for mask qualification may result in millions of defect candidates prior to RDD. This can cause tool choking and dropped defects when transferring results from the inspection system to the high level defect detection controller. RDD may be subject of the same limitations of maximum number of defects and defects density as random defect detection inspection, although the final number of defects of interest (DOIs), such as repeaters, may be reasonably small. It should be noted that many repeater defects are "soft" repeaters. Soft repeaters are not printed in every reticle due to process variation. This means that it may not be possible to use in-job RDD while being able to analyze results for the whole wafer.

With feature shrink and a potential resolution limit for optical wafer inspection tools, the primary candidate inspection tool for print check is an electron beam inspection tool, such as a scanning electron microscope (SEM). However, electron beam inspection tools have a throughput disadvantage. With the best scenario of multiple beam/column options, the estimated inspection time for one reticle is more than 8 hours. Broad band plasma (BBP) tools have much higher throughput and, hence, coverage. In the current BBP tool design, repeater analysis is part of the post-processing step in the high level defect detection controller. Due to architecture limitations (both software and hardware), there may be a limit of less than 10 million defects that result using current BBP tool configurations. However, estimations show that about 10 billion defects may need to be handled. Optimization of throughput and development time is a serious challenge for RDD.

Furthermore, current inspections are performed using die-to-die comparisons and show high levels of nuisance due to design systematic nuisance events. These nuisance events can be real defects, but are known to be non-critical defects. Detection of DOI can be impaired because there are too many systematic nuisance events.

Therefore, improved RDD is needed.

BRIEF SUMMARY OF THE DISCLOSURE

In a first embodiment, a method to detect repeater defects is disclosed. The method includes performing a hot scan inspection of an entire surface of a wafer. A position of defects from the hot scan inspection is stored to a storage medium. The storage medium is persistent storage, random access memory, or a split database. Using a processor, coordinates for repeater defect detection are determined. The wafer is inspected based on the coordinates for repeater defect detection. Repeater defects are analyzed using the processor. Corresponding defect records to the repeater defects are retrieved from the storage medium.

A patch-based virtual inspector virtual analyzer or local storage can be used for the storage medium The method can further include freeing space in the storage medium after the retrieving.

The method can further include saving coordinates of the defects in shared memory prior to the determining.

In an instance, a first die and a second die are each imaged using a reticle at two different positions on a first wafer and two different positions on a second wafer. In this instance, the method includes calculating a first wafer difference image in a first wafer step and calculating a second wafer difference image in a second wafer step. Calculating the first wafer difference image in the first wafer step includes calculating, using the processor, a difference image of the first die and the second die at a second position on the first wafer. Using the processor, a difference image of the first die at the second position on the first wafer and the second die at a first position on the first wafer is calculated. Using the processor, the first wafer difference image of the two difference images of the first wafer step is calculated.

Calculating a second wafer difference image in a second wafer step includes calculating, using the processor, a difference image of the first die and the second die at a second position on the second wafer. Using the processor, a difference image of the first die at the second position on the first wafer and the second die at a first position on the second wafer is calculated. Using the processor, the second wafer difference image of the two difference images of the second wafer step is calculated.

Using the processor, systematic defects can be found in the first wafer difference image using coordinate-based defect source analysis. Using the processor, the systematic defects in the first wafer difference image can be subtracted from the second wafer difference image. Using the processor, existence of a defect of interest in the second wafer difference image can be determined after the subtracting.

In an instance, a first die and a second die are each imaged using a reticle at two different positions on a first wafer and two different positions on a second wafer. In this instance, the method includes calculating a first wafer difference image in a first wafer step and calculating a second wafer difference image in a second wafer step. Calculating a first wafer difference image in a first wafer step includes calculating, using the processor, a difference image of the first die and the second die at a second position on the first wafer. Using the processor, a difference image of the first die at the second position on the first wafer and the second die at a first position on the first wafer is calculated. Using the processor, the first wafer difference image of the two difference images of the first wafer step is calculated.

Calculating a second wafer difference image in a second wafer step includes calculating, using the processor, a difference image of the first die and the second die at a second position on the second wafer. Using the processor, a difference image of the first die at the second position on the first wafer and the second die at a first position on the second wafer is calculated. Using the processor, the second wafer difference image of the two difference images of the second wafer step is calculated.

Using the processor, the second wafer difference image is subtracted from the first wafer difference image. Using the processor, existence of a defect of interest in the second wafer difference image is determined after the subtracting.

In an instance, a first die and a second die are each imaged using a reticle at two different positions on a first wafer and two different positions on a second wafer. In this instance, a wafer difference image is calculated, which includes calculating, using the processor, a difference image of the first die and the second die at a second position on the second wafer; calculating, using the processor, a difference image of the first die at the second position on the first wafer and the second die at a first position on the second wafer; and calculating, using the processor, the wafer difference image of the two resulting difference images. Using the processor, existence of a defect of interest in the wafer difference image is determined. Images are retrieved from the storage medium. The images are at a same location on the first wafer as the first die and the second die on the second wafer. Using the processor, presence of the defect of interest is evaluated in the images from the storage medium. Using the processor, nuisance is filtered from the wafer difference image.

In a second embodiment, a method for filtering nuisance is provided. The method comprises imaging a first die and a second die using a reticle at two different positions on a first wafer and two different positions on a second wafer. A difference image of the second wafer in a second wafer step is calculated by: calculating, using a processor, a difference image of the first die and the second die at a second position on the second wafer; calculating, using the processor, a difference image of the first die at the second position on the first wafer and the second die at a first position on the second wafer; and calculating, using the processor, the difference image of the second wafer using the two difference images of the second wafer step. Using the processor, existence of a defect of interest in the wafer difference image of the second wafer is determined.

The method can further comprise retrieving images from the storage medium. The images are at a same location on the first wafer as the first die and the second die on the second wafer. Using the processor, presence of the defect of interest in the images from the storage medium is evaluated. Using the processor, nuisance is filtered from the second wafer difference image.

The method can further comprise calculating a difference image of the first wafer in a first wafer step. Calculating a difference image of the first wafer in a first wafer step includes calculating, using the processor, a difference image of the first die and the second die at a second position on the first wafer. Using the processor, a difference image of the first die at the second position on the first wafer and the second die at a first position on the first wafer is calculated. Using the processor, the wafer difference image of the first wafer using the two difference images of the first wafer step is calculated. Using the processor, systematic defects in the difference image of the first wafer are found using coordinate-based defect source analysis. Using the processor, the systematic defects in the difference image of the first wafer are subtracted from the difference image of the second wafer. Determining existence of the defect of interest in the difference image of the second wafer is after the subtracting.

The method can further comprise calculating a difference image of the first wafer in a first wafer step. Calculating a difference image of the first wafer in a first wafer step includes calculating, using the processor, a difference image of the first die and the second die at a second position on the first wafer. Using the processor, a difference image of the first die at the second position on the first wafer and the second die at a first position on the first wafer is calculated. Using the processor, the difference image of the first wafer using the two difference images of the first wafer step is calculated. Using the processor, the difference image of the second wafer is subtracted from the difference image of the first wafer. Determining existence of the defect of interest in the difference image of the second wafer is after the subtracting.

In a third embodiment, a system is provided. The system comprises a controller in electronic communication with a wafer inspection tool. The controller includes a processor and an electronic data storage unit in electronic communication with the processor. The electronic data storage unit includes persistent storage, random access memory, or a split database. The controller is configured to: receive results of a hot scan inspection of an entire surface of a wafer from the wafer inspection tool; store a position of defects from the hot scan inspection to the electronic data storage unit; determine coordinates for repeater defect detection; send instructions to inspect the wafer based on the coordinates for repeater defect detection; analyze repeater defects; and retrieve corresponding defect records to the repeater defects from the electronic data storage unit.

The electronic data storage unit may be included in a patch-based virtual inspector virtual analyzer. The electronic data storage unit also may be local storage.

The controller may be configured to save coordinates of the defects in shared memory prior to determine the repeater defect detection jobs.

In an instance, a first die and a second die are each imaged using a reticle at two different positions on a first wafer and two different positions on a second wafer. The controller is further configured to calculate a first wafer difference image in a first wafer step and calculate a second wafer difference image in a second wafer step. Calculating a first wafer difference image in a first wafer step includes: calculating a difference image of the first die and the second die at a second position on the first wafer; calculating a difference image of the first die at the second position on the first wafer and the second die at a first position on the first wafer; and calculating the first wafer difference image of the resulting difference images of the first wafer step. Calculating a second wafer difference image in a second wafer step includes: calculating a difference image of the first die and the second die at a second position on the second wafer; calculating a difference image of the first die at the second position on the first wafer and the second die at a first position on the second wafer; and calculating the second wafer difference image of the resulting difference images of the second wafer step. Systematic defects in the first wafer difference image are found using coordinate-based defect source analysis. The systematic defects in the first wafer difference image are subtracted from the second wafer difference image. Existence of a defect of interest in the second wafer difference image is determined after the subtracting.

In an instance, a first die and a second die are each imaged using a reticle at two different positions on a first wafer and two different positions on a second wafer. The controller is further configured to calculate a first wafer difference image in a first wafer step and calculate a second wafer difference image in a second wafer step. Calculating a first wafer difference image in a first wafer step includes: calculating a difference image of the first die and the second die at a second position on the first wafer; calculating a difference image of the first die at the second position on the first wafer and the second die at a first position on the first wafer; and calculating the first wafer difference image of the resulting difference images of the first wafer step. Calculating a second wafer difference image in a second wafer step includes: calculating a difference image of the first die and the second die at a second position on the second wafer; calculating a difference image of the first die at the second position on the first wafer and the second die at a first position on the second wafer; and calculating the second wafer difference image of the resulting difference images of the second wafer step. The second wafer difference image is subtracted from the first wafer difference image. Existence of a defect of interest in the second wafer difference image is determined after the subtracting.

In an instance, a first die and a second die are each imaged using a reticle at two different positions on a first wafer and two different positions on a second wafer. The controller is further configured to calculate a wafer difference image. Calculating the wafer difference image includes: calculating a difference image of the first die and the second die at a second position on the second wafer; calculating a difference image of the first die at the second position on the first wafer and the second die at a first position on the second wafer; and calculating the wafer difference image of the resulting difference images. Existence of a defect of interest in the second wafer difference image is determined. Images are retrieved from the electronic data storage unit. The images are at a same location on the first wafer as the first die and the second die on the second wafer. Presence of the defect of interest in the images from the electronic data storage unit is evaluated. Nuisance is filtered from the wafer difference image.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

RDD can overcome the previous limitations. The mechanisms disclosed herein are based on the high accuracy of the defect location to perform RDD at, for example, better than ±0.5 pixel. Repeater coordinates can be a strong filter that will suppress a majority of the random defects in a hot inspection, which can enable use of lower thresholds. Repeaters may be detectable by at least one defect detection algorithm. If the defect is deep in the noise floor, then the problem shifts from RDD into normal defect detection space.

Patch images and attributes can help with nuisance reduction. However, having patches and/or attributes for a final lot result may involve keeping patches and attributes of all events before RDD. The size of total patches from 10 billion defects likely will not fit into memory. Furthermore, writing patches for all detected events before RDD to storage and retrieving patches for detected repeaters from storage takes time on an inspection tool.

The embodiments disclosed herein take advantage of a storage medium, such as virtual inspector virtual analyzer (VIVA) storage, which may be in a separate tool or system from the inspection system. This can avoid the throughput challenge of writing or reading to disk. Patches and attributes can be kept for set up only. Attributes can be limited and no patches may be used for production.

There are several techniques to achieve high defect density for candidate defects disclosed herein.

Figure 1:
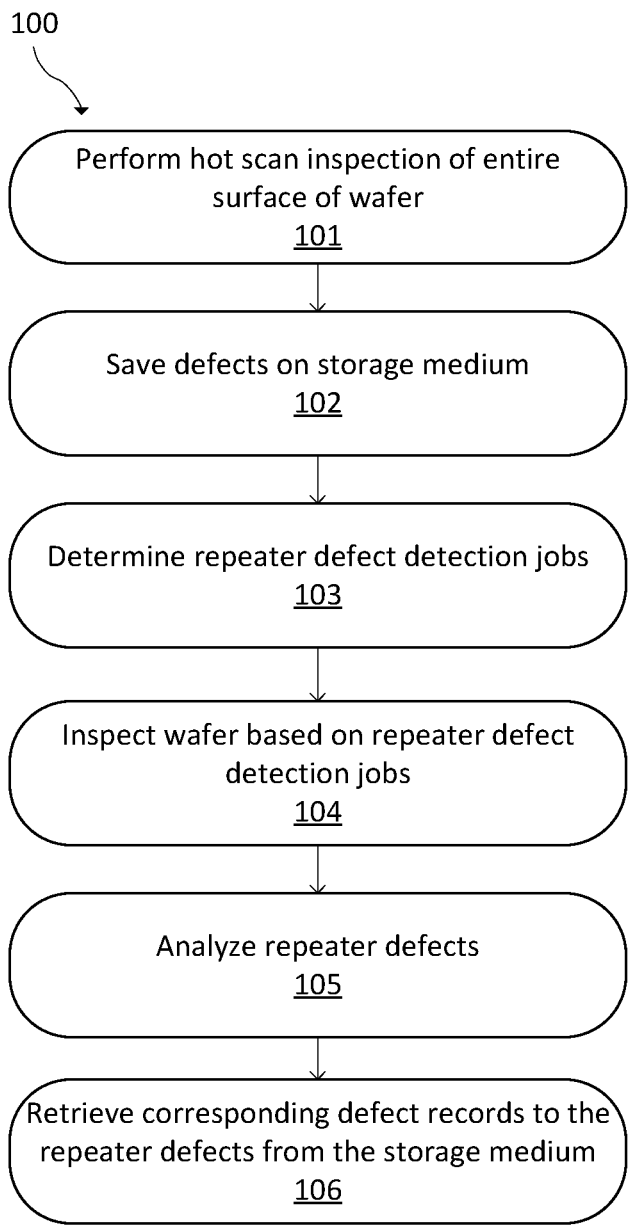
FIG. 1 is an embodiment of a method in accordance with the present disclosure.

FIG. 1 is an embodiment of a method 100 to detect repeater defects. This can use a split database such that coordinates can be saved in the image computer (IMC) of the inspection tool and attributes can be saved on the solid state drive (SSD), such as an SSD included in the IMC. At 101, a hot scan inspection of an entire surface of a wafer is performed, such as using a BBP tool, a laser scanning tool, an electron beam inspector, or other inspection systems. At 102, positions of defects from the hot scan inspection are stored to a storage medium, such as persistent storage, random access memory (RAM), or a split database. The persistent storage can be patch-based VIVA or local (e.g., on the node) storage. Both might be a hybrid hard drive (HDD) or SSD. Patch-based VIVA or local storage can be used for the persistent storage.

At 103, coordinates for RDD (e.g., the RDD jobs) are determined, such as using a processor. The wafer is inspected based on the coordinates for RDD at 104. Repeater defects are analyzed at 105. Corresponding defect records to the repeater defects are retrieved from the persistent storage at 106. These may be returned to the high level defect detection controller.

The method 100 can further include freeing space in the persistent storage after the retrieving.

The method 100 can further include saving coordinates of the defects in shared memory prior to the determining at 103.

The method 100 is based on RDD usually requiring only defect coordinates. Neither patches nor attributes are necessary because the RDD algorithm uses defect coordinates based on a definition of a repeater defect. Additional filtering based on attributes and/or patches can be done as a separate step before or after RDD. This means that a defect structure can be saved for every defect candidate on VIVA or on the local node redundant array of independent disks (RAID) and defect coordinates can be kept in the shared memory. This reduces the size of the defect structure used for RDD to bounding box coordinates (e.g., four integers) and die row, swath in a die-row, frame number, or other features. The whole defect may take only eight integers in shared memory buffer. Up to 1,900 defects per frame can be kept without increase of the installed dynamic random-access memory (DRAM). After the RDD is performed, the corresponding patches and defect attributes can be uploaded from the storage. This can be sent to the high level defect detection controller or other controllers.

Variations of the method 100 are illustrated in FIGS. 6-9. FIGS. 6-9 are different ways to realize the sequence described by FIG. 1 and provide different trade-offs between speed and the amount of details available. FIGS. 6-9 also demonstrate that RDD inspection setup can be performed either on VIVA or on the inspection tool, which can be a compromise between tool utilization and necessity to have additional hardware, such as VIVA.

Data storage can be freed immediately after inspection. It may be possible to achieve 0.6 GB/s per node writing speed. This translates into 5,000 seconds (approximately 84 minutes) to save 3 TB of data that may be needed for 300 defect candidates per frame. This input/output can work in parallel with data processing, which will increase throughput. Bandwidth can be doubled with SSD and inspection time can be reduced.

The embodiment can provide a comprehensive solution for RDD of weak defects and soft repeaters. The change of the architecture that may be needed for RDD of weak defects may be reused for other applications.

In an instance, two-pass RDD is performed based on IMC. A first pass does not report anything to the user interface and saves coordinates in the IMC memory. A second pass reads coordinates, extracts patches, and computes attributes for repeaters only. This can balance hardware costs with a throughput reduction, which may be suitable for prototype development.

RDD jobs or other coordinates for RDD can save defect coordinates in shared memory and skip patch extraction and defect attributes calculation. After wafer swathing is done, RDD jobs that can find repeaters among the saved defect candidates are issued. The repeater coordinates can be returned to a controller and/or the high level defect detection controller. Defect images and attributes can be extracted from these locations. Defect patches and defect attributes can be returned for repeater locations.

For prototyping, results based on the coordinates for RDD can be saved in the shared memory and normal defect detection jobs can be used for the second pass. Corresponding files with repeater coordinates can be read and either defect detection jobs are converted into SRI ones or an empty result buffer is returned.

In another instance, job level repeaters detection is performed. This can increase a job size to cover a full length of a die row. Frame-to-frame alignment can be precise and accurate inside one job, so it may be possible to do repeater detection as post-processing with tight tolerances (e.g., smaller than pixel). The job size is increased to a full die row. Not all dies may be used for feature image (median) computation. For example, twelve frames may be sufficient for feature image computation. Only die repeaters will be returned and further repeater analysis will be performed by the high level defect detection controller to suppress die repeaters and keep reticle repeaters. This can provide relatively high throughput.

In another instance, a patch-based VIVA approach is used. All defect candidates can be saved on the patch-based VIVA. A special application can run RDD on defect candidate patches and attributes instead of full wafer images. This can provide relatively high throughput.

All defect candidates can be saved on the patch-based VIVA. VIVA capacity may be approximately ten defects per frame for fifteen plane inspection, so 150 defects per frame can likely be handled with a single plane version. There may be no need to keep these defect candidates for any significant amount of time. Candidates from one inspection can be recorded, processed, and the data can be removed. This can enable hotter inspections. With high defect density, the whole wafer image can be saved on VIVA while defect coordinates are kept in the parallel database. RDD may only need coordinates and defect patches can be extracted later for repeaters only.

During operation, hot inspections are run and all defect candidates are saved on VIVA. The tool is then available for next inspection. On the VIVA, a new inspection type for RDD is initialized, repeaters are found using defect coordinates, and these are saved as part of patch records. Defect locations, attributes, and patches are then returned to the high level defect detection controller. These defect locations, attributes, and patches may have already been calculated and pre-saved on VIVA.

In another instance, a special swath layout approach is used. The same swath can be scanned in every die row, the process can return to an initial point, and the next swath can be scanned. The number of defects saved by the high level defect detection controller can be reduced by changing the swathing sequence. Instead of swathing every die-row sequentially, every first swath can be swathed for every die-row, all defects can be reported, and then every second swath for every die-row is swathed. This process can be repeated. In an example, up to four swaths are performed in every die-row. Four columns may be work independently in this example. The controller receives results, can perform inter-job and inter-sub-swath merging before sending defects to the high level defect detection controller. The high level defect detection controller can run RDD with zero pixel coordinate tolerance.

Alternatively, all defects can be reported to the high level defect detection controller that will run RDD prior to saving defects to the disk.

In another instance, an IMC-based RDD is used. All defect candidates may be kept in the IMC memory. Thus, the biggest portion of the RDD is done in the IMC.

All defect candidates can be accumulated in the IMC memory up to the end of wafer inspection. Normal defect detection can be run and a return of a "no defects" result can buffer to the controller. All defect candidates can be saved in the shared memory.

For example, assume that the system is using two columns and six nodes per column and the size of the defect structure (s) is about 10 KB. If 120,000,000 defect candidates per wafer are desired, then 10,000,000 defects per node may need to be kept in shared memory. This translates into 100,000,000,000 bytes or about 100 GB of shared memory per node. For a 300 mm wafer and 50 nm pixel size, an inspection can contain about 28,260,000 frames. Without patches, 200 defects per frame can be achieved. If the node memory is increased to 1 TB, approximately 50 to 60 defect candidates per frame can be handled. An SSD can be used at every node rather than increasing the amount of DRAM.

After defect detection is done and all defect candidates are in the shared memory, a controller can either spawn a new process or submit new jobs (e.g., of new job type). Inter-job defects merge can be performed and RDD can be performed using the defect candidates available. Since the data in the shared memory can be organized by swath-sub-swath number, load balancing can be done by assigning swath-sub-swath number to process to CPU core. After the RDD is done, repeaters can be returned in a result buffer.

Defect candidate density can be increased by an order of magnitude (e.g., 90 defects per frame) if defect patches are dropped and the size of the defect structure is reduced, such as to about 1 KB.

In another instance, a special swath layout is combined with IMC-based RDD. This can reduce IMC memory requirements. This technique enables extreme defect candidate density and improved sensitivity.

Defect candidates detection can be performed for every first swath (i.e., every two swaths taking columns into account) for all die-rows keeping all defect candidates in the node shared memory. RDD can be performed for these candidates. Results can be returned to the controller and high level defect detection controller without collecting the data for the rest of the wafer. The whole shared memory can be used for this small part of the wafer. Defect candidates density can be increased proportionally.

For example, the longest swath on the 300 mm wafer and 50 nm pixel is about 6,000 frames per swath and 120,000 frames per swath-die-row (assuming 20 die-rows on a wafer). For 100 GB shared memory, this can handle 10,000,000 defects per swath or 83 defects per frame. For shorter swaths defect density can be higher and may be 160 defects per frame on average.

Swathing can be optimized for throughput and to reduce number of Y-motions for shorter swaths.

If the node memory is increased to 512 GB and 400 GB is used for defect storage shared memory, then about 350 defects per frame can be saved.

This technique can be run hotter and may reach 1,600 defects per frame without defect patches. However, instead of collecting two swaths per die-row, twelve swath per die row can be performed to cover the whole wafer in four sets of swaths.

In an embodiment, soft repeaters can be identified and nuisance in repeater defect images can be reduced. Repeater defects can include both hard repeaters (which are always visible on a die) and soft repeaters (which may not always be visible on a die). If only a limited number of dies are imaged, it can be challenging to detect repeater defects and can be especially challenging to detect soft repeaters.

In an instance, a first wafer can be inspected and/or recorded at t=0 to detect and/or record systematic nuisance on a reticle. This can be part of an integrated solution for EUV mask inspection. At t>0 (e.g., three weeks later), a second wafer can be inspected and/or recorded. Systematic nuisance in t>0 can be subtracted from t=0. Random reticle defects can be reported. This can provide a lower nuisance rate and, thus, higher sensitivity to DOI. For example, t=0 can be when the reticle is clean and/or problem-free and t>0 can mean that there are particles on and/or other problems with the reticle. These other problems may be caused by misalignment during printing or reticle defects.

Figure 3:
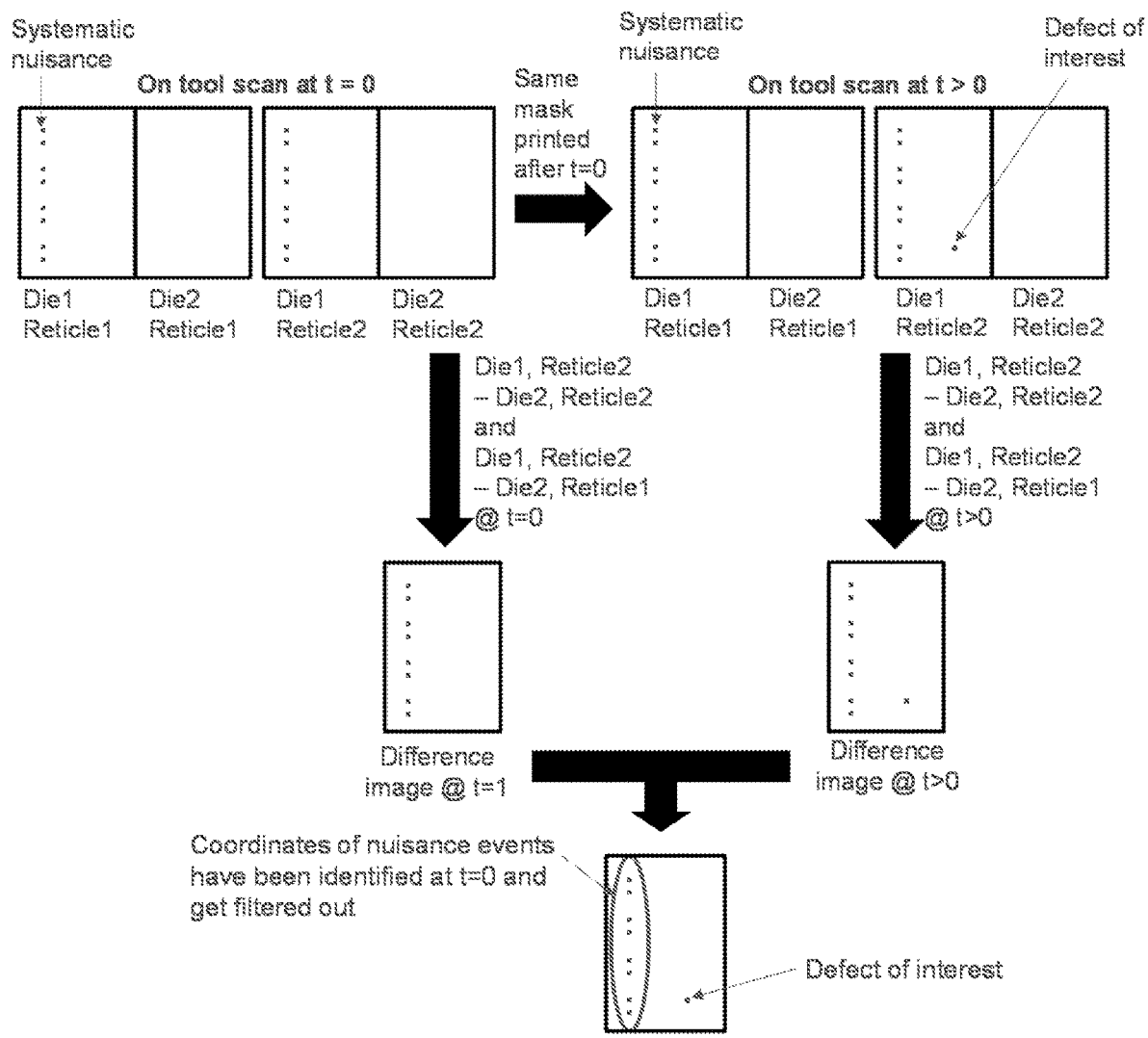
FIG. 3 is a first embodiment of nuisance reduction in accordance with the present disclosure.

FIG. 3 is a first embodiment of nuisance reduction. A first die and a second die are each imaged using a reticle at two different positions (reticle1, reticle2) on a first wafer (t=0) and two different positions (reticle1, reticle2) on a second wafer (t>0). The two different positions may be, for example, different rows on the wafer. The first die and the second die may be neighboring dies or may have other spatial relationships. The image processing steps may be performed by a processor.

A first wafer difference image is calculated. To do so, a difference image of the first die and the second die at a second position on the first wafer is calculated. A difference image of the first die at the second position on the first wafer and the second die at a first position on the first wafer also is calculated. Then the first wafer difference image is calculated from the two resulting difference images.

A second wafer difference image is calculated. To do so, a difference image of the first die and the second die at a second position on the second wafer is calculated. A difference image of the first die at the second position on the first wafer and the second die at a first position on the second wafer also is calculated. Then the second wafer difference image is calculated from the two resulting difference images.

Systematic defects in the first difference image can be found using coordinate-based defect source analysis. The systematic defects in the first wafer difference image can be subtracted from the second wafer difference image based on their coordinates. Existence of a DOI in the second wafer difference image can be determined after the common (e.g., systematic) defects have been excluded.

Figure 4:
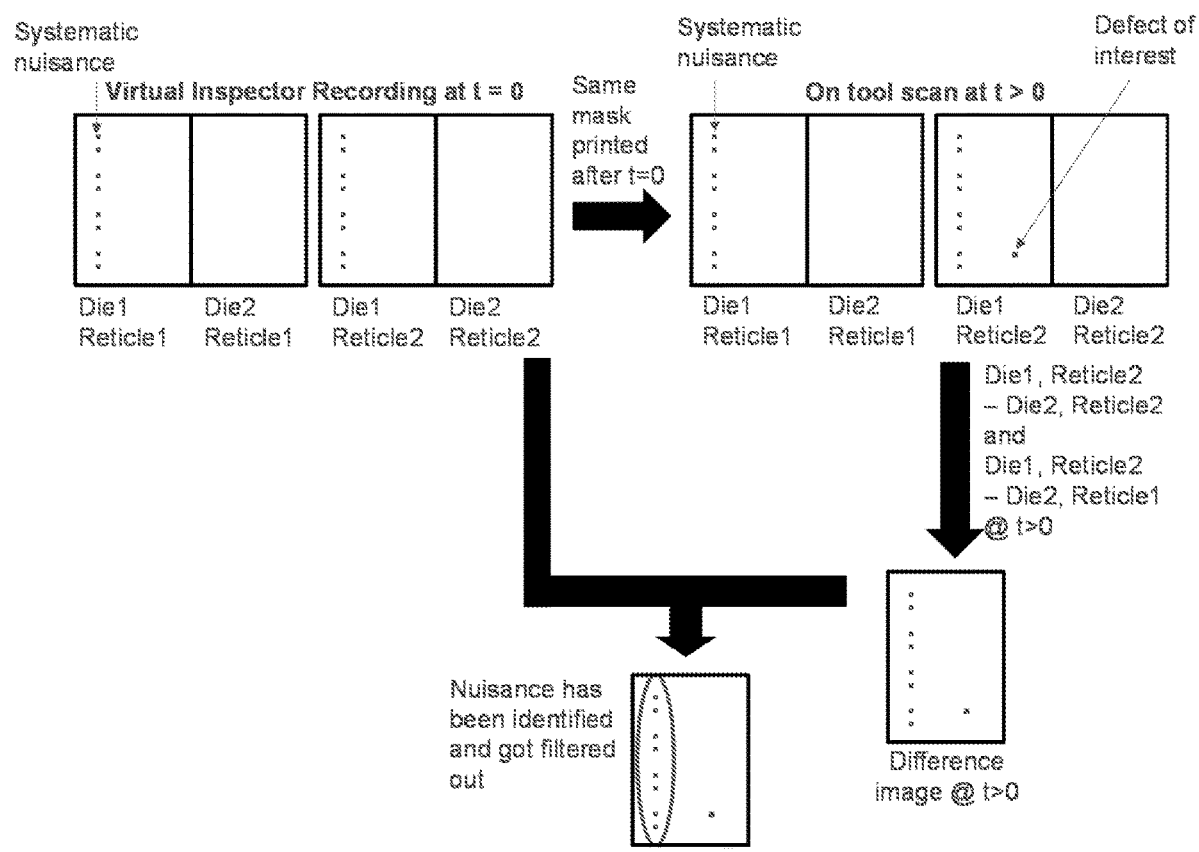
FIG. 4 is a second embodiment of nuisance reduction in accordance with the present disclosure.

FIG. 4 is a second embodiment of nuisance reduction. A first die and a second die are each imaged using a reticle at two different positions (reticle1, reticle2) on a first wafer (t=0) and two different positions (reticle1, reticle2) on a second wafer (t>0). The two different positions may be, for example, different rows on the wafer. The first die and the second die may be neighboring dies or may have other spatial relationships. The image processing steps may be performed by a processor.

A difference image of the first die and the second die at a second position on the second wafer is calculated. A difference image of the first die at the second position on the first wafer and the second die at a first position on the second wafer is calculated. Then a wafer difference image is calculated from the two resulting difference images.

Existence of a defect of interest in the wafer difference image is determined. Images can be retrieved from the storage medium. The images are at the same location on the first wafer (e.g., t=0) as the first die and the second die on the second wafer that were used in the calculating.

Presence of the defect of interest can be evaluated in the images from the storage medium. Nuisance can be filtered from the wafer difference image.

Figure 5:
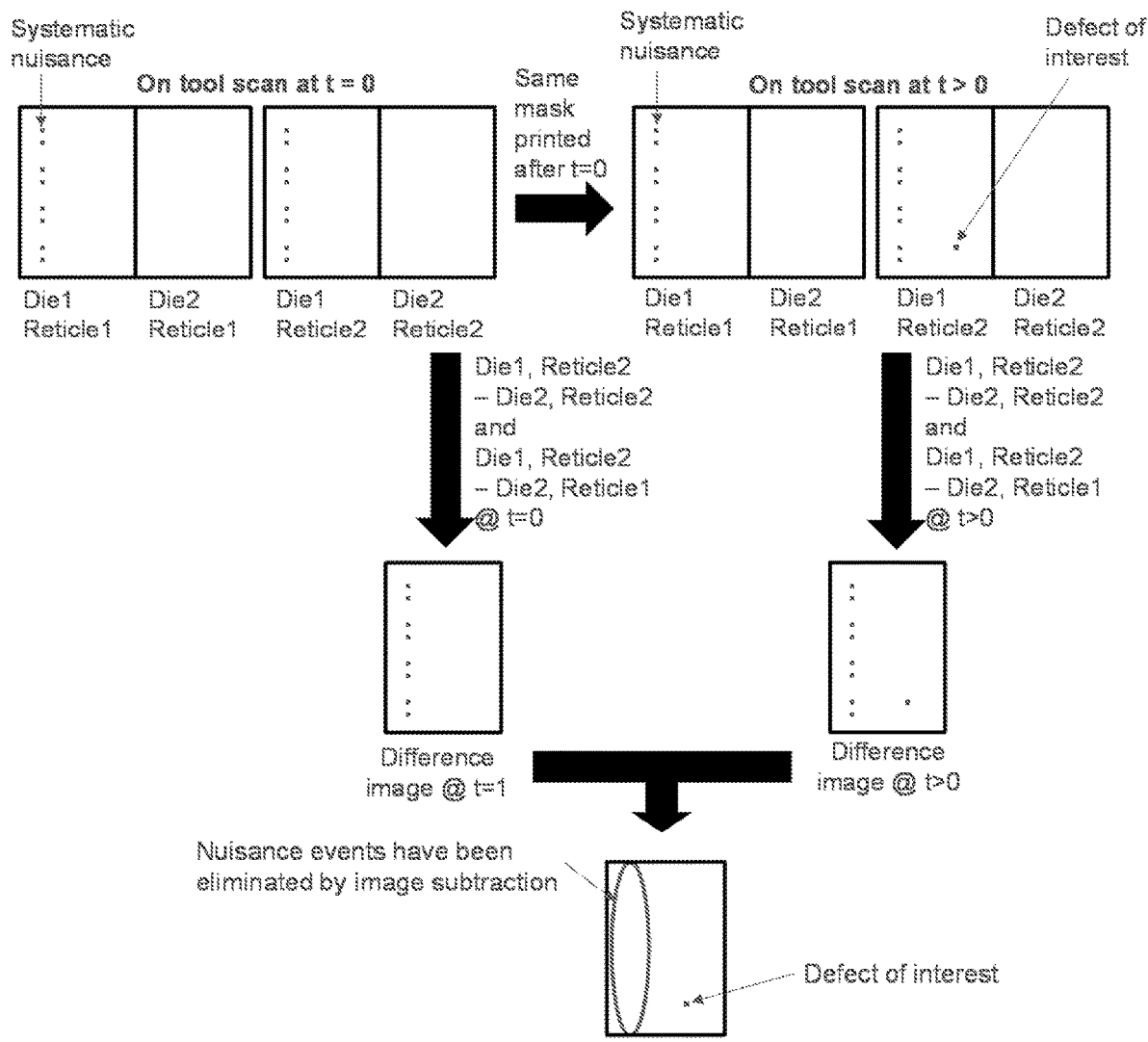
FIG. 5 is a third embodiment of nuisance reduction in accordance with the present disclosure.
Figure 6:
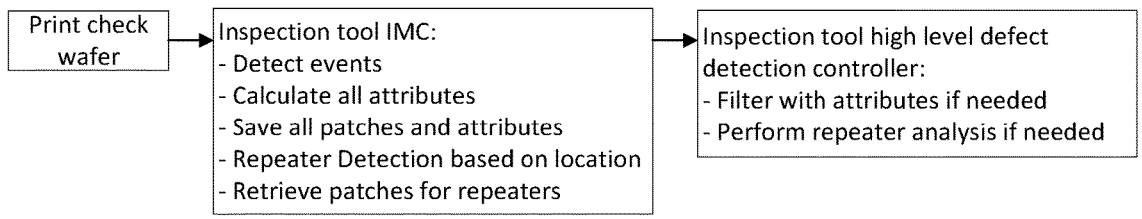
FIGS. 6-9 are variations of the embodiment of the method illustrated in FIG. 1.
Figure 6:
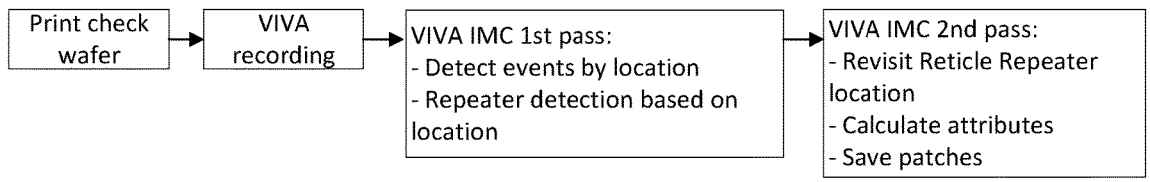
Figure 7:
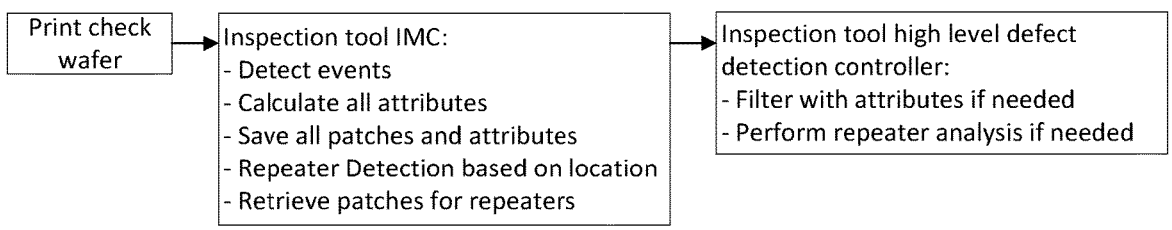
Figure 7:
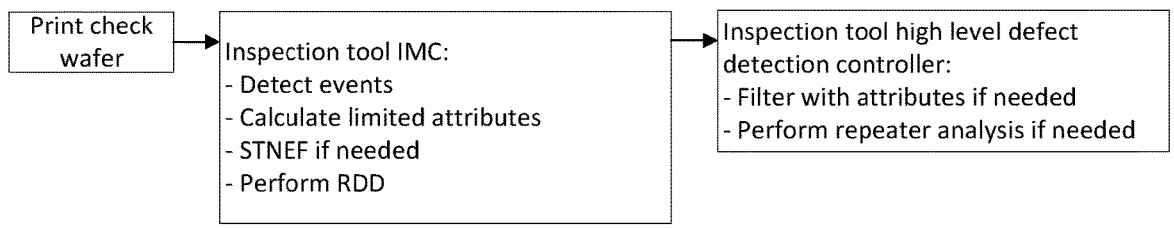
Figure 8:
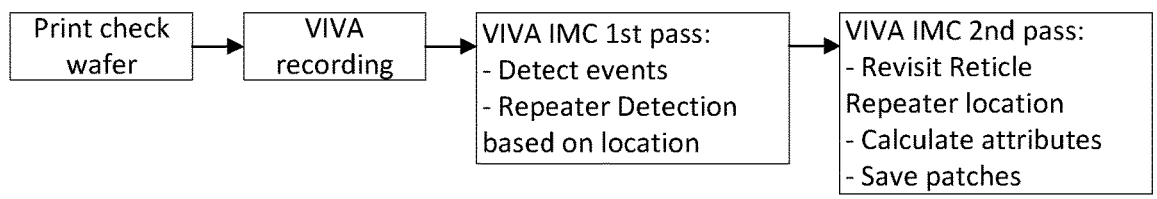
Figure 8:
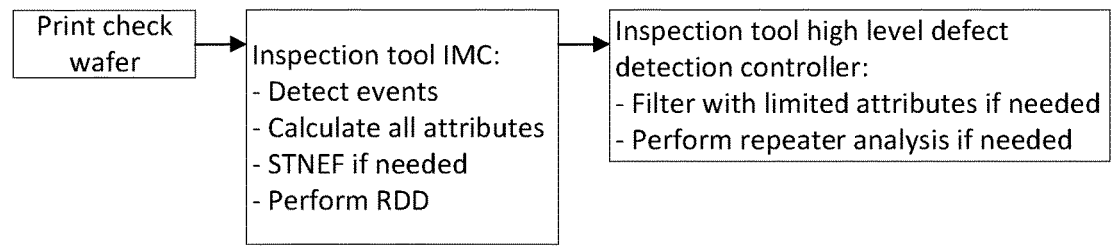
Figure 9:
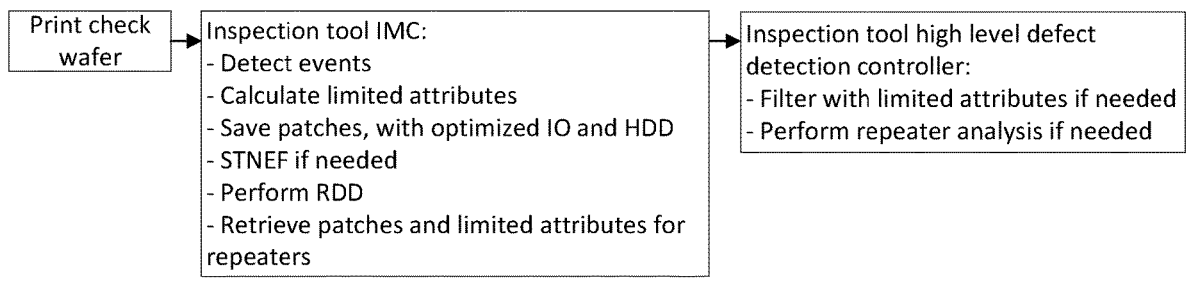
Figure 9:
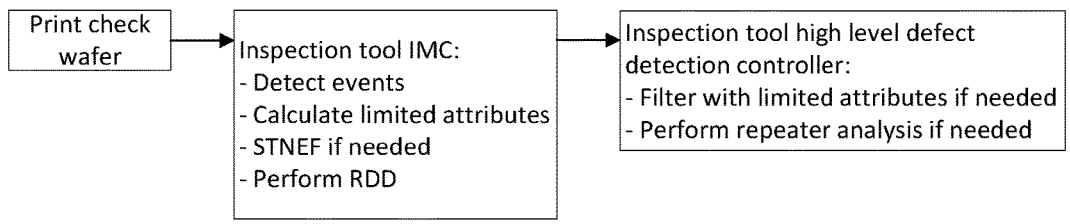

FIG. 5 is a third embodiment of nuisance reduction. A first die and a second die are each imaged using a reticle at two different positions (reticle1, reticle2) on a first wafer (t=0) and two different positions (reticle1, reticle2) on a second wafer (t>0). The two different positions may be, for example, different rows on the wafer. The first die and the second die may be neighboring dies or may have other spatial relationships. The image processing steps may be performed by a processor.

A first wafer difference image is calculated. To do so, a difference image of the first die and the second die at a second position on the first wafer is calculated. A difference image of the first die at the second position on the first wafer and the second die at a first position on the first wafer also is calculated. Then the first wafer difference image is calculated from the two resulting difference images.

A second wafer difference image is calculated. To do so, a difference image of the first die and the second die at a second position on the second wafer is calculated. A difference image of the first die at the second position on the first wafer and the second die at a first position on the second wafer also is calculated. Then the second wafer difference image is calculated from the two resulting difference images.

The second wafer difference image is subtracted from the first wafer difference image. Existence of a defect of interest in the second wafer difference image can be determined after the subtracting.

Figure 2:
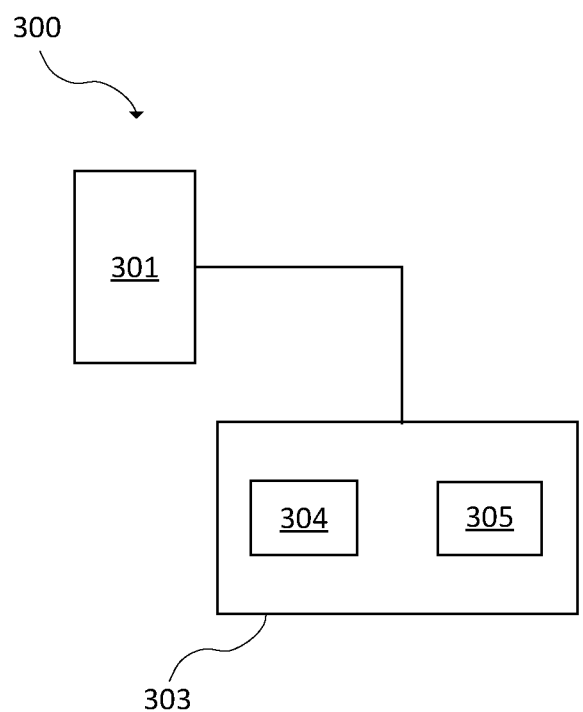
FIG. 2 is a block diagram of a system in accordance with the present disclosure.

FIG. 2 is a system drawing of a system 300. The system 300 includes a wafer inspection tool 301 and a controller 303 with a processor 304 and an electronic data storage unit 305 in electronic communication with the processor 304. The wafer inspection tool 301 may be a BBP tool, which can be configured to perform a hot scan to capture inspection results. The wafer inspection tool also may be a laser scanning tool, an electron beam inspector, or other inspection systems. The controller 303 is in electronic communication with the wafer inspection tool 301.

The controller 303 may be part of the wafer inspection tool 301, or another device. In an example, the controller 303 may be a standalone control unit or in a centralized quality control unit. Multiple controllers 303 may be used.

The controller 303 may be implemented in practice by any combination of hardware, software, and firmware. Also, its functions as described herein may be performed by one unit, or divided up among different components, each of which may be implemented in turn by any combination of hardware, software and firmware. Program code or instructions for the controller 303 to implement various methods and functions may be stored in controller readable storage media, such as a memory in the electronic data storage unit 305 or other memory.

The controller 303 may be coupled to the components of the system 300 in any suitable manner (e.g., via one or more transmission media, which may include wired and/or wireless transmission media) such that the controller 303 can receive the output generated by the system 300. The controller 303 may be configured to perform a number of functions using the output.

The controller 303, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

An additional embodiment relates to a non-transitory computer-readable medium storing program instructions executable on a controller for performing a computer-implemented defect detection or wafer inspection, as disclosed herein. In particular, the processor 304 can be coupled to a memory in the electronic data storage unit 305 or other electronic data storage medium with non-transitory computer-readable medium that includes program instructions executable on the processor 304. The computer-implemented method may include any step(s) of any method(s) described herein. For example, the controller 303 may be programmed to perform some or all of the steps of FIG. 1, FIGS. 3-5, or other embodiments disclosed herein, which can be executed by the processor 304. The memory in the electronic data storage unit 305 or other electronic data storage medium may be a storage medium such as a magnetic or optical disk, a magnetic tape, or any other suitable non-transitory computer-readable medium known in the art. In particular, the electronic data storage unit can include persistent storage, random access memory, or a split database.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), SSE (Streaming SIMD Extension), or other technologies or methodologies, as desired.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include one or more layers formed upon a substrate. For example, such layers may include, but are not limited to, a resist, a dielectric material, and a conductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features. Formation and processing of such layers of material may ultimately result in completed devices. Many different types of devices such as integrated circuits may be formed on a wafer, and the term wafer as used herein is intended to encompass a wafer on which any type of device known in the art is being fabricated. As used herein, the term "chip" may comprise a collection of integrated circuits designed for a particular purpose.

Although embodiments are described herein with respect to wafers, it is to be understood that the embodiments may be used for another specimen such as a reticle, which may also be commonly referred to as a mask or a photomask. Many different types of reticles are known in the art, and the terms "reticle," "mask," and "photomask" as used herein are intended to encompass all types of reticles known in the art.

Each of the steps of the method may be performed as described herein. The methods also may include any other step(s) that can be performed by the controller and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method to detect repeater defects comprising:
performing a hot scan inspection of an entire surface of a wafer;
storing a position of defects from the hot scan inspection to a storage medium, wherein the storage medium is persistent storage, random access memory, or a split database;
determining, using a processor, coordinates for repeater defect detection;
inspecting the wafer based on the coordinates for repeater defect detection, wherein a first die and a second die are each imaged using a reticle at two different positions on a first wafer and two different positions on a second wafer;
calculating a first wafer difference image in a first wafer step by:
calculating, using the processor, a difference image of the first die and the second die at a second position on the first wafer;
calculating, using the processor, a difference image of the first die at the second position on the first wafer and the second die at a first position on the first wafer; and
calculating, using the processor, the first wafer difference image of the two difference images of the first wafer step;
analyzing repeater defects using the processor; and
retrieving corresponding defect records to the repeater defects from the storage medium.

2. The method of claim 1, wherein a patch-based virtual inspector virtual analyzer is used for the storage medium.

3. The method of claim 1, wherein local storage is used for the storage medium.

4. The method of claim 1, further comprising freeing space in the storage medium after the retrieving.

5. The method of claim 1, further comprising saving coordinates of the defects in shared memory prior to the determining.

6. The method of claim 1, further comprising:
calculating a second wafer difference image in a second wafer step by:
calculating, using the processor, a difference image of the first die and the second die at a second position on the second wafer;
calculating, using the processor, a difference image of the first die at the second position on the first wafer and the second die at a first position on the second wafer; and
calculating, using the processor, the second wafer difference image of the two difference images of the second wafer step;
finding, using the processor, systematic defects in the first wafer difference image using coordinate-based defect source analysis;
subtracting, using the processor, the systematic defects in the first wafer difference image from the second wafer difference image; and
determining, using the processor, existence of a defect of interest in the second wafer difference image after the subtracting.

7. The method of claim 1, further comprising:
calculating a second wafer difference image in a second wafer step by:
calculating, using the processor, a difference image of the first die and the second die at a second position on the second wafer;
calculating, using the processor, a difference image of the first die at the second position on the first wafer and the second die at a first position on the second wafer; and
calculating, using the processor, the second wafer difference image of the two difference images of the second wafer step;
subtracting, using the processor, the second wafer difference image from the first wafer difference image; and
determining, using the processor, existence of a defect of interest in the second wafer difference image after the subtracting.

8. The method of claim 1, further comprising:
determining, using the processor, existence of a defect of interest in the first wafer difference image;
retrieving images from the storage medium, wherein the images are at a same location on the first wafer as the first die and the second die on the second wafer;
evaluating, using the processor, presence of the defect of interest in the images from the storage medium; and
filtering, using the processor, nuisance from the first wafer difference image.

9. A method for filtering nuisance comprising:
imaging a first die and a second die using a reticle at two different positions on a first wafer and two different positions on a second wafer;
calculating a difference image of the second wafer in a second wafer step by:

calculating, using a processor, a difference image of the first die and the second die at a second position on the second wafer;

calculating, using the processor, a difference image of the first die at the second position on the first wafer and the second die at a first position on the second wafer; and calculating, using the processor, the difference image of the second wafer using the two difference images of the second wafer step; and determining, using the processor, existence of a defect of interest in the wafer difference image of the second wafer.

10. The method of claim 9, further comprising:

retrieving images from the storage medium, wherein the images are at a same location on the first wafer as the first die and the second die on the second wafer;

evaluating, using the processor, presence of the defect of interest in the images from the storage medium; and filtering, using the processor, nuisance from the second wafer difference image.

11. The method of claim 9, further comprising:

calculating a difference image of the first wafer in a first wafer step by:

calculating, using the processor, a difference image of the first die and the second die at a second position on the first wafer;

calculating, using the processor, a difference image of the first die at the second position on the first wafer and the second die at a first position on the first wafer; and calculating, using the processor, the wafer difference image of the first wafer using the two difference images of the first wafer step;

finding, using the processor, systematic defects in the difference image of the first wafer using coordinate-based defect source analysis; and subtracting, using the processor, the systematic defects in the difference image of the first wafer from the difference image of the second wafer, wherein the determining existence of the defect of interest in the difference image of the second wafer is after the subtracting.

12. The method of claim 9, further comprising:

calculating a difference image of the first wafer in a first wafer step by:

calculating, using the processor, a difference image of the first die and the second die at a second position on the first wafer;

calculating, using the processor, a difference image of the first die at the second position on the first wafer and the second die at a first position on the first wafer; and calculating, using the processor, the difference image of the first wafer using the two difference images of the first wafer step; and subtracting, using the processor, the difference image of the second wafer from the difference image of the first wafer, wherein the determining existence of the defect of interest in the difference image of the second wafer is after the subtracting.

13. A system comprising:

a controller in electronic communication with a wafer inspection tool, wherein the controller includes a processor and an electronic data storage unit in electronic communication with the processor, wherein the electronic data storage unit includes persistent storage, random access memory, or a split database, and wherein the controller is configured to:

receive results of a hot scan inspection of an entire surface of a wafer from the wafer inspection tool;

store a position of defects from the hot scan inspection to the electronic data storage unit;

determine coordinates for repeater defect detection;

send instructions for inspection of the wafer based on the coordinates for repeater defect detection, wherein a first die and a second die are each imaged using a reticle at two different positions on a first wafer and two different positions on a second wafer;

calculate a first wafer difference image in a first wafer step by:

calculating a difference image of the first die and the second die at a second position on the first wafer;

calculating a difference image of the first die at the second position on the first wafer and the second die at a first position on the first wafer; and calculating the first wafer difference image of the resulting difference images of the first wafer step;

analyze repeater defects; and retrieve corresponding defect records to the repeater defects from the electronic data storage unit.

14. The system of claim 13, wherein the electronic data storage unit is included in a patch-based virtual inspector virtual analyzer.

15. The system of claim 13, wherein the electronic data storage unit is local storage.

16. The system of claim 13, wherein the controller is configured to save coordinates of the defects in shared memory prior to determine the repeater defect detection jobs.

17. The system of claim 13, wherein the controller is further configured to:

calculate a second wafer difference image in a second wafer step by:

calculating a difference image of the first die and the second die at a second position on the second wafer;

calculating a difference image of the first die at the second position on the first wafer and the second die at a first position on the second wafer; and calculating the second wafer difference image of the resulting difference images of the second wafer step;

find systematic defects in the first wafer difference image using coordinate-based defect source analysis;

subtract the systematic defects in the first wafer difference image from the second wafer difference image; and determine existence of a defect of interest in the second wafer difference image after the subtracting.

18. The system of claim 13, wherein the controller is further configured to:

calculate a second wafer difference image in a second wafer step by:

calculating a difference image of the first die and the second die at a second position on the second wafer;

calculating a difference image of the first die at the second position on the first wafer and the second die at a first position on the second wafer; and calculating the second wafer difference image of the resulting difference images of the second wafer step;

subtract the second wafer difference image from the first wafer difference image; and determine existence of a defect of interest in the second wafer difference image after the subtracting.

19. The system of claim 13, wherein the controller is further configured to:

determine existence of a defect of interest in the first wafer difference image;

retrieve images from the electronic data storage unit, wherein the images are at a same location on the first wafer as the first die and the second die on the second wafer;

evaluate presence of the defect of interest in the images from the electronic data storage unit; and filter nuisance from the first wafer difference image.

* * * * *